US007756171B2

(12) United States Patent
Jacques

(10) Patent No.: US 7,756,171 B2
(45) Date of Patent: Jul. 13, 2010

(54) METHOD AND APPARATUS FOR LASER CONTROL IN A TWO CHAMBER GAS DISCHARGE LASER

(75) Inventor: Robert N. Jacques, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 12/255,347

(22) Filed: Oct. 21, 2008

(65) Prior Publication Data

US 2010/0098122 A1    Apr. 22, 2010

(51) Int. Cl.
H01S 3/13 (2006.01)
H01S 3/00 (2006.01)
H01S 3/22 (2006.01)

(52) U.S. Cl. .............. 372/29.015; 372/38.07; 372/55

(58) Field of Classification Search ............ 372/29.015, 372/38.07, 55, 57, 87
See application file for complete search history.

(56) References Cited

U.S. PATENT DOCUMENTS

| | | | | |
|---|---|---|---|---|
| 4,223,279 A | 9/1980 | Bradford, Jr. et al. | ...... | 331/94.5 |
| 4,410,992 A | 10/1983 | Javan | ...... | 372/32 |
| 4,455,658 A | 6/1984 | Sutter et al. | ...... | 372/38 |
| 4,959,840 A | 9/1990 | Akins et al. | ...... | 372/57 |
| 5,023,884 A | 6/1991 | Akins et al. | ...... | 372/57 |
| 5,025,445 A | 6/1991 | Anderson et al. | ...... | 372/20 |
| 5,025,446 A | 6/1991 | Kuizenga | ...... | 372/21 |
| 5,189,678 A | 2/1993 | Ball et al. | ...... | 372/28 |
| 5,313,481 A | 5/1994 | Cook et al. | ...... | 372/37 |
| 5,315,611 A | 5/1994 | Ball et al. | ...... | 372/56 |
| 5,359,620 A | 10/1994 | Akins | ...... | 372/58 |
| 5,416,391 A | 5/1995 | Correa et al. | ...... | 318/558 |
| 5,448,580 A | 9/1995 | Birx et al. | ...... | 372/38 |
| 5,471,965 A | 12/1995 | Kapich | ...... | 123/565 |
| 5,675,616 A | 10/1997 | Hulbert et al. | ...... | 375/355 |
| 5,771,258 A | 6/1998 | Morton et al. | ...... | 372/57 |
| 5,852,621 A | 12/1998 | Sandstrom | ...... | 372/25 |
| 5,863,017 A | 1/1999 | Larson et al. | ...... | 248/176.1 |
| 5,953,360 A | 9/1999 | Vitruk et al. | ...... | 372/87 |
| 5,978,394 A | 11/1999 | Newman et al. | ...... | 372/32 |
| 5,982,800 A | 11/1999 | Ishihara et al. | ...... | 372/57 |
| 5,991,324 A | 11/1999 | Knowles et al. | ...... | 372/57 |
| 6,005,879 A | 12/1999 | Sandstrom et al. | ...... | 372/25 |
| 6,014,398 A | 1/2000 | Hofmann et al. | ...... | 372/60 |

(Continued)

OTHER PUBLICATIONS

PCT Search Report dated Dec. 14, 2009, International Patent Application No. PCT/US09/05694, filed on Oct. 20, 2009 (8 pages).

(Continued)

Primary Examiner—Armando Rodriguez
(74) Attorney, Agent, or Firm—Gard & Kaslow LLP

(57) ABSTRACT

A laser control system contains an oscillator gas chamber and an amplifier gas chamber. A first voltage input is operatively connected to deliver electrical pulses to a first pair of electrodes within the oscillator gas chamber and a second pair of electrodes within the amplifier gas chamber. An output of the gas chambers is an energy dose calculated by a trapezoidal window. A control circuit connects to the first voltage input for modifying the first voltage input. A feedback control loop communicates an output of the gas chambers to the control circuit for modifying the first voltage input.

20 Claims, 6 Drawing Sheets

U.S. PATENT DOCUMENTS

| | | | |
|---|---|---|---|
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38 |
| 6,151,349 A | 11/2000 | Gong et al. | 372/58 |
| 6,154,681 A | 11/2000 | Drees et al. | 700/19 |
| 6,164,116 A | 12/2000 | Rice et al. | 73/1.72 |
| 6,188,710 B1 | 2/2001 | Besaucele et al. | 372/60 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,212,211 B1 | 4/2001 | Azzola et al. | 372/33 |
| 6,219,368 B1 | 4/2001 | Govorkov | 372/59 |
| 6,240,117 B1 | 5/2001 | Gong et al. | 372/58 |
| 6,314,119 B1 | 11/2001 | Morton | 372/57 |
| 6,317,447 B1 | 11/2001 | Partlo et al. | 372/57 |
| 6,330,261 B1 | 12/2001 | Ishihara et al. | 372/38.1 |
| 6,359,922 B1 | 3/2002 | Partlo et al. | 372/58 |
| 6,396,856 B1 | 5/2002 | Sucha et al. | 372/25 |
| 6,414,979 B2 | 7/2002 | Ujazdowski et al. | 372/87 |
| 6,466,365 B1 | 10/2002 | Maier et al. | 359/355 |
| 6,477,193 B2 | 11/2002 | Oliver et al. | 372/58 |
| 6,535,531 B1 | 3/2003 | Smith et al. | 372/25 |
| 6,538,737 B2 | 3/2003 | Sandstrom et al. | 356/333 |
| 6,671,294 B2 | 12/2003 | Kroyan et al. | 372/20 |
| 6,687,562 B2 | 2/2004 | Patel et al. | 700/121 |
| 6,721,340 B1 | 4/2004 | Fomenkov et al. | 372/25 |
| 6,750,972 B2 | 6/2004 | Sandstrom et al. | 356/454 |
| 6,757,316 B2 | 6/2004 | Newman et al. | 372/57 |
| 6,625,191 B2 | 9/2004 | Knowles et al. | 372/55 |
| 6,795,454 B2 | 9/2004 | Partlo et al. | 372/57 |
| 6,853,653 B2 | 2/2005 | Spangler et al. | 372/20 |
| 6,882,674 B2 | 4/2005 | Wittak et al. | |
| 7,079,564 B2 | 7/2006 | Fallon et al. | 372/55 |
| 2003/0219094 A1 | 11/2003 | Basting et al. | 378/34 |
| 2003/0234854 A1 | 12/2003 | Hattori | 347/235 |
| 2005/0109743 A1 | 5/2005 | Tanabe et al. | 219/121.73 |
| 2005/0169341 A1 | 8/2005 | Bergmann et al. | 372/81 |
| 2006/0120426 A1 | 6/2006 | Kuwata | 372/50.124 |
| 2006/0146900 A1 | 7/2006 | Jacques et al. | 372/38.1 |
| 2006/0239307 A1 | 10/2006 | Nakao et al. | 372/29.011 |
| 2007/0195836 A1 | 8/2007 | Dunstan et al. | 372/32 |

OTHER PUBLICATIONS

Burnett, Levine, Shirley & Bruning, "Symmetry of Spatial-Dispersion-Induced Birefringence and its Implications of $CaF_2$ Ultraviolet Optics," J. Microlith., Microsyst., vol. 1, No. 3, Oct. 2002.

METHOD AND APPARATUS FOR LASER CONTROL IN A TWO CHAMBER GAS DISCHARGE LASER

FIELD

The disclosed subject matter is generally related to laser systems and, more particularly, is related to a laser control system for a two chamber gas discharge laser.

BACKGROUND

FIG. 1 is an illustration of a block diagram of a MOPA (Master Oscillator/Power Amplifier) laser system 10 as is known in the prior art. The MOPA laser system 10 is used, for instance, in the area of integrated circuit lithography. In one embodiment of the MOPA laser system 10, a 193 nm ultraviolet laser beam is provided at the input port of a lithography machine/scanner 2 such as stepper or scanner machines supplied by Canon or Nikon with facilities in Japan or ASML with facilities in the Netherlands. The MOPA laser system 10 includes a laser energy control system 4 for controlling both pulse energy and accumulated dose energy output of the system at pulse repetition rates, for instance, of 4,000 Hz or greater. The MOPA laser system 10 provides extremely accurate triggering of the discharges in the two laser chambers relative to each other with both feedback and feed-forward control of the pulse and dose energy.

The main components of the laser system 4 are often installed below the deck/floor 5 on which the scanner 2 is installed. However, the MOPA laser system 10 includes a beam delivery unit 6, which provides an enclosed beam path for delivering the laser beam to an input port of scanner 2. The light source includes a seed laser generator, e.g., a master oscillator 11 and an amplifier laser portion, e.g., a power amplifier 12, described in more detail below, and which may also be an oscillator, e.g., a power ring oscillator ("PRA"), also described in more detail below. For convenience sake throughout this application the seed laser may be referred to as an MO and the amplifier laser may be referred to as a power amplifier or simply a PA, with the intent to cover other forms of seed laser arrangements and amplifier laser arrangements, such as a power ring amplifier ("PRA"), which is in fact an oscillator, i.e., a power oscillator ("PO"), together forming a MOPO, and unless expressly stated otherwise these terms are meant to be so broadly defined. The light source also includes a pulse stretcher 22.

The master oscillator 11 and the power amplifier/power oscillator 12 each include a discharge chamber 11A, 12A similar to the discharge chamber of single chamber lithography laser systems. These chambers 11A, 12A contain two electrodes, a laser gas, a tangential for circulating the gas between the electrodes and water-cooled finned heat exchangers. The master oscillator 11 produces a first laser beam 14A which is amplified, in a PA configuration by two passes through the power amplifier 12, or in the case of a PO/PRA configuration, by oscillation in the PO/PRA, to produce a second laser beam 14B as shown in FIG. 1. The master oscillator 11 includes a resonant cavity formed by an output coupler 11C and a line narrowing package 11B. The gain medium for the master oscillator 11 is produced between two elongated electrodes contained within the master oscillator discharge chamber 11A. The power amplifier 12 is basically a discharge chamber 12A and in this preferred embodiment is almost exactly the same as the master oscillator discharge chamber 11A providing a gain medium between two electrodes, but the power amplifier 12 may have no resonant cavity, unlike a PO/PRA. This MOPA laser system 10 configuration permits the master oscillator 11 to be designed and operated to maximize beam quality parameters such as wavelength stability and very narrow bandwidth; whereas the power amplifier 12 is designed and operated to maximize power output. For this reason the MOPA laser system 10 represents a much higher quality and much higher power laser light source than single chamber systems.

As noted above the amplifier portion may be configured, e.g., for two beam passages through the discharge region of the amplifier discharge chamber, or for oscillation in the cavity containing the amplifier discharge chamber, as shown in FIG. 1. The beam oscillates within the cavity containing the master oscillation chamber 11A between LNP 11B and output coupler 11C (with 30 percent reflectance) of the MO 11 and is severely line narrowed on its passages through LNP 10C. A wavelength of a laser beam emitted from the output coupler 11C is measured by a line center analysis module 7. The line narrowed seed beam is reflected downward by a mirror in the MO wavelength engineering box (MO WEB) 24 and reflected horizontally at an angle slightly skewed (with respect to the electrodes orientation) through the PA wavelength engineering box (PA WEB) 26 to the amplifier chamber 12. At the back end of the amplifier, a beam reverser 28 reflects the beam back for a second pass through PA chamber 12, or for oscillation in the PO/PRA chamber, horizontally in line with the electrodes orientation. A spectral analysis module 9 measures a bandwidth of a laser emitted from the discharge chamber 12A.

The laser system output beam pulses 14B pass from the PA/PO chamber 12A to a beam splitter 16. The beam splitter 16 reflects about 60 percent of the power amplifier output beam 14B into a delay path created by four focusing mirrors 20A, 20B, 20C and 20D. The 40 percent transmitted portion of each pulse of beam 14B becomes a first hump of a corresponding stretched pulse of an output beam pulse 14C. The output beam 14C is directed by beam splitter 16 to mirror 20A which focuses the reflected portion to point 22. The beam then expands and is reflected from mirror 20B which converts the expanding beam into a parallel beam and directs it to mirror 20C which again focuses the beam again at point 22. This beam is then reflected by mirror 20D which like the 20B mirror changes the expanding beam to a light parallel beam and directs it back to beam splitter 16 where 60 percent of the first reflected light is reflected perfectly in line with the first transmitted portion of this pulse in output beam 14C to become most of a second hump in the laser system output beam pulse. The 40 percent of the reflected beam transmits beam splitter 16 and follows exactly the path of the first reflected beam producing additional smaller humps in the stretched pulse. The result is the completed output beam 14C which is stretched in pulse length from about 20 ns to about 70 ns. A beam delivery unit (BDU) delivers the output beam 14C. The BDU may include two beam-pointing mirrors 40A, 40B one or both of which may be controlled to provide tip and tilt correction for variations beam pointing.

FIG. 2 is an illustration of an energy control block diagram 50 for the MOPA/MOPO Laser System of FIG. 1, in accordance with the prior art. FIG. 2 illustrates various control elements that control a voltage supply 52 to the MOPA laser system 10. The energy control block diagram 50 includes a static control 54, which provides a basically determined voltage anticipated to achieve an energy target 56 (if there are no other influences for which account need be made). A feed forward block 58 provides a voltage adjustment based on a trigger interval 60. Trigger interval 60 is used to compute repetition rate, shot number and duty cycle, which impact the 'voltage input—energy output' relationship. The voltage adjustment is computed as a function of these values. An energy servo 62 adjusts the voltage input 52 based on a calculated voltage error 64 of the previous shot. A dither cancellation 66 adjusts voltage to cancel energy changes caused by a timing dither 68. Finally, an energy dither 70 provides a periodic signal added to the voltage input 52 used to estimate the effects of voltage on MO energy, output energy, and MOPA timing. These five voltage signals are added together to generate the voltage input 52. As the laser fires, the energy 72 is measured. The energy target is subtracted from the measured energy 72 to create an energy error signal 74, which is scaled by dV/dE, the laser estimate 76 of the derivative of voltage with respect to energy. The resulting voltage error 64 is used to drive adaptation algorithms 78 which adjust some of the voltage signals in a way that minimizes either energy errors, dose errors, energy sigma, or some combination thereof.

The MOPA laser system 10 shown in FIG. 1 is an improvement on the single chamber systems, providing greater beam control, beam power, and stability than the single chamber systems. However, resolving tonal disturbances and further sharpening timing and energy control of the system can significantly improve operation.

SUMMARY

Aspects of embodiments of the disclosed subject matter provide a system and method for controlling a laser system. Briefly described, in architecture, aspects of one possible embodiment of the system, among others, can be implemented as follows. The system contains an oscillator gas chamber and an amplifier gas chamber. A first voltage input is operatively connected to deliver electrical pulses to a first pair of electrodes within the oscillator gas chamber and a second pair of electrodes within the amplifier gas chamber. An output of the gas chambers is an energy dose calculated by a trapezoidal window. A control circuit connects to the first voltage input for modifying the first voltage input. A feedback control loop communicates an output of the gas chambers to the control circuit for modifying the first voltage input.

Aspects of the disclosed subject matter can also be viewed as providing methods for controlling a laser system. In this regard, one embodiment of such a method, among others, can be broadly summarized by the following steps: delivering a first voltage input operatively in the form of electrical pulses to a first pair of electrodes within a oscillator gas chamber and a second pair of electrodes within a amplifier gas chamber; calculating an energy dose of an output of the gas chambers with a trapezoidal window; modifying the first voltage input with a control circuit; and communicating an output of the gas chambers to the control circuit with a feedback control loop for modifying the first voltage input.

Other systems, methods, features, and advantages of the disclosed subject matter will be or become apparent to one with skill in the art upon examination of the following drawings and detailed description. It is intended that all such additional systems, methods, features, and advantages be included within this description, be within the scope of the disclosed subject matter, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the disclosed subject matter. Moreover, in the drawings, like reference numerals designate corresponding parts throughout the several views.

DETAILED DESCRIPTION

Figure 1:
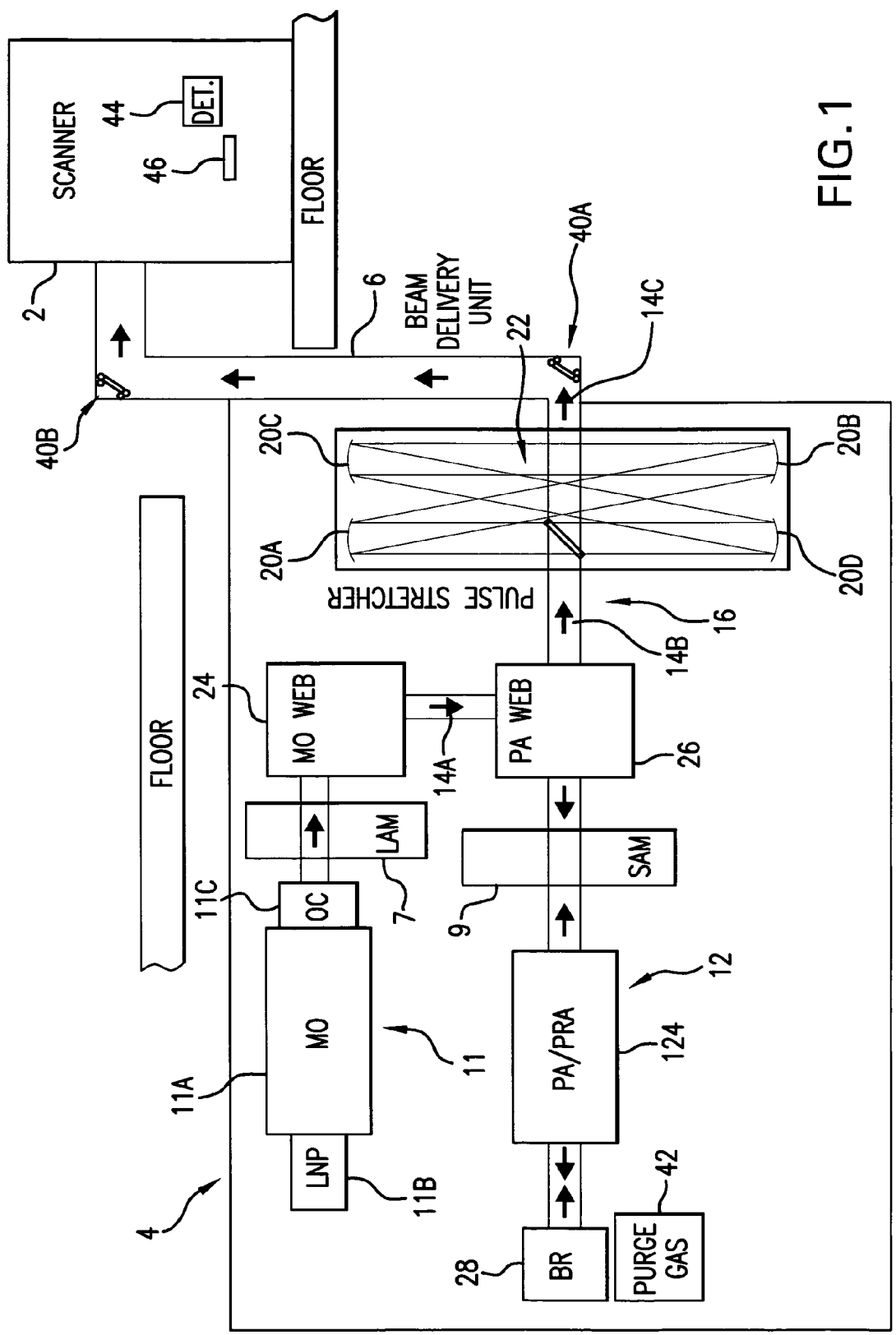
FIG. 1 is an illustration of a block diagram of a MOPA/MOPRA Laser System.
Figure 2:
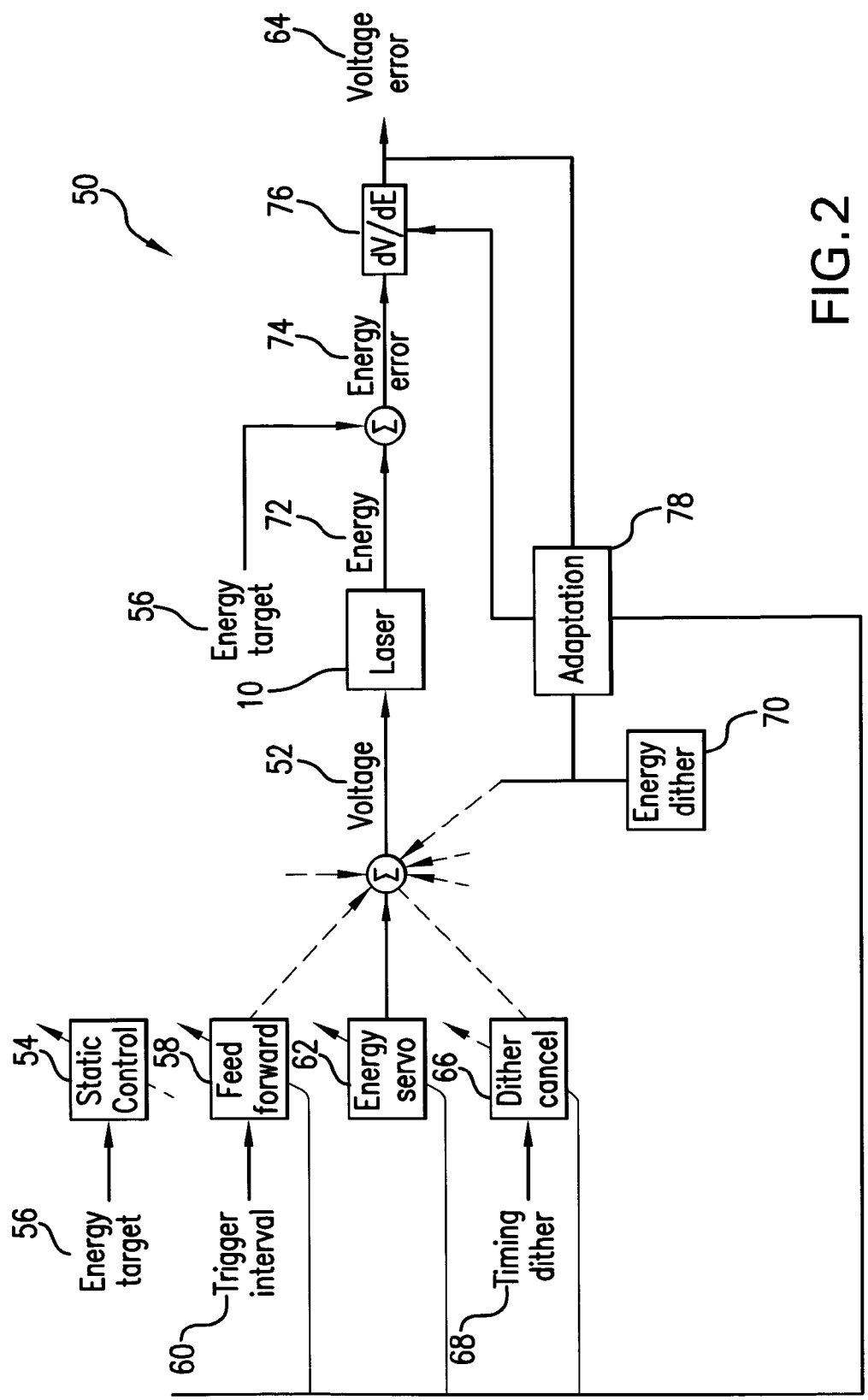
FIG. 2 is an illustration of an energy control block diagram for the MOPA/MOPRA Laser System of FIG. 1.
Figure 3:
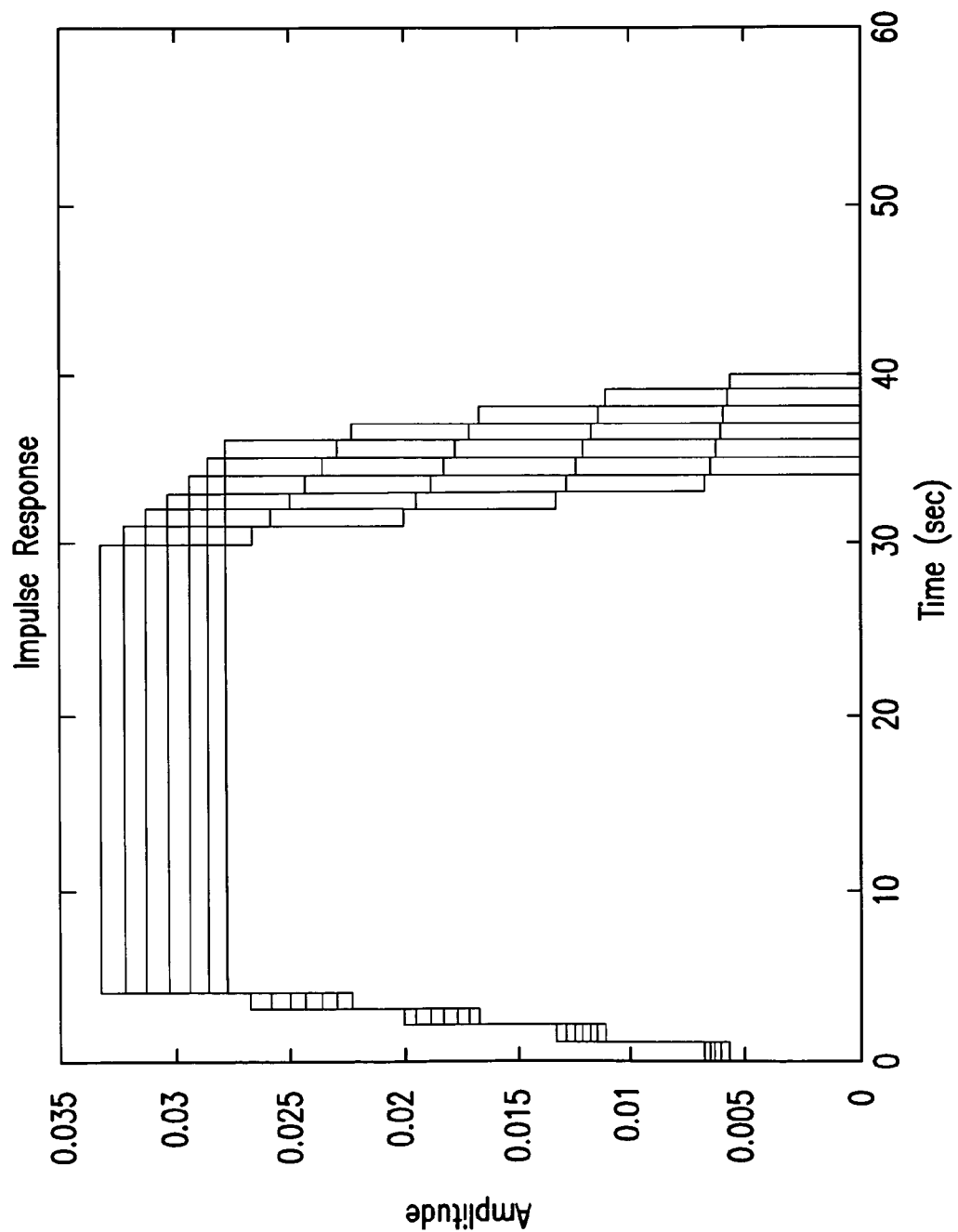
FIG. 3 is an illustration of a graph representing trapezoidal windows of varying repetition rates, in accordance with a first exemplary embodiment of the disclosed subject matter.
Figure 4:
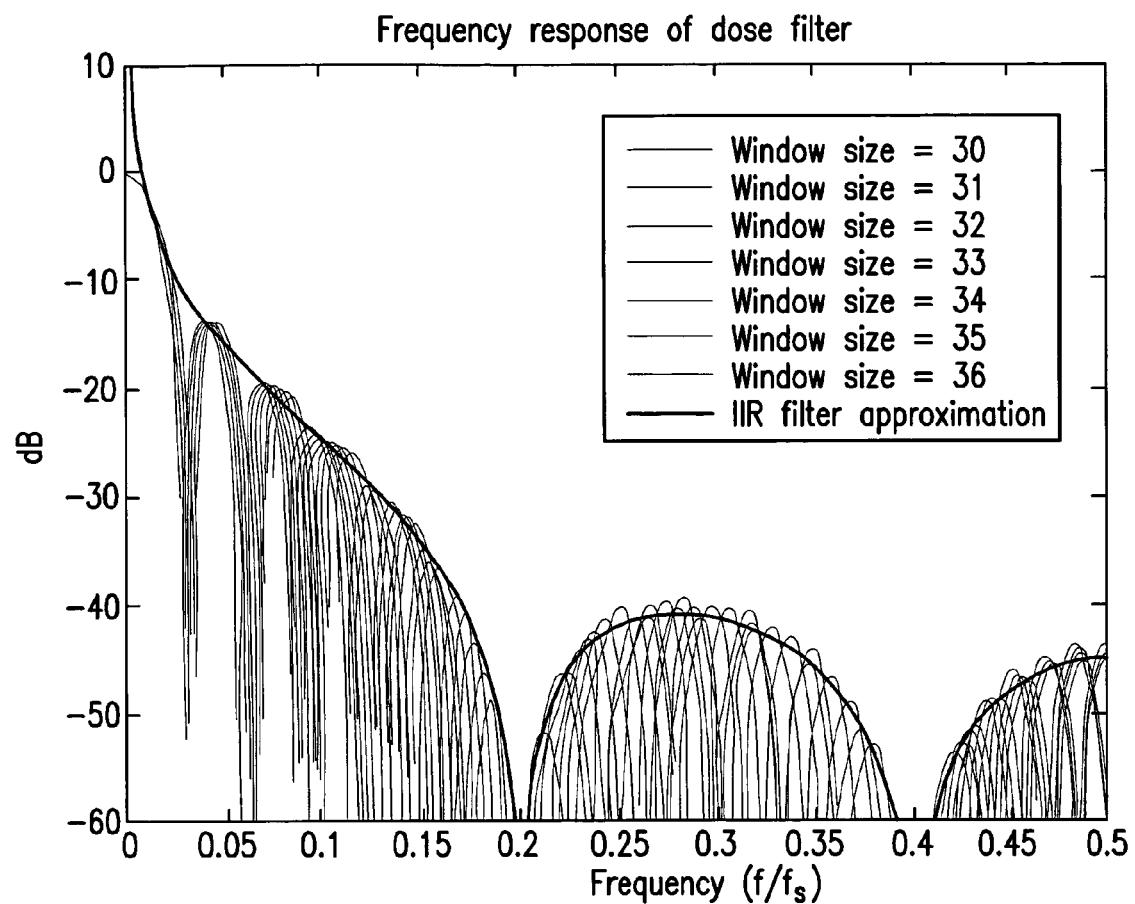
FIG. 4 is an illustration of a graph of a frequency response of the dose operator for the windows illustrated in FIG. 3, in accordance with a first exemplary embodiment of the disclosed subject matter.

Elements of the disclosed subject matter are based upon the recognition that while square windows have been used in the past for energy dose calculation, some benefits may be realized by adapting to alternative shaped windows. FIG. 3 is an illustration of a graph representing trapezoidal windows of varying repetition rates, in accordance with a first exemplary embodiment of the disclosed subject matter. FIG. 4 is an illustration of a graph of a frequency response of the dose operator for the windows illustrated in FIG. 3, in accordance with aspects of a first exemplary embodiment of the disclosed subject matter. Note that while there are a set of zeros that vary for varying window widths, there are clearly zeros for all windows at 20% and 40% of the sample rate. These zeros correspond to the zeros of a 5 pulse moving average. It can be shown that a trapezoidal window is the convolution of a rectangular window having a length equal to the window size, less the trailing edge and a 5 pulse rectangular window.

Figure 5:
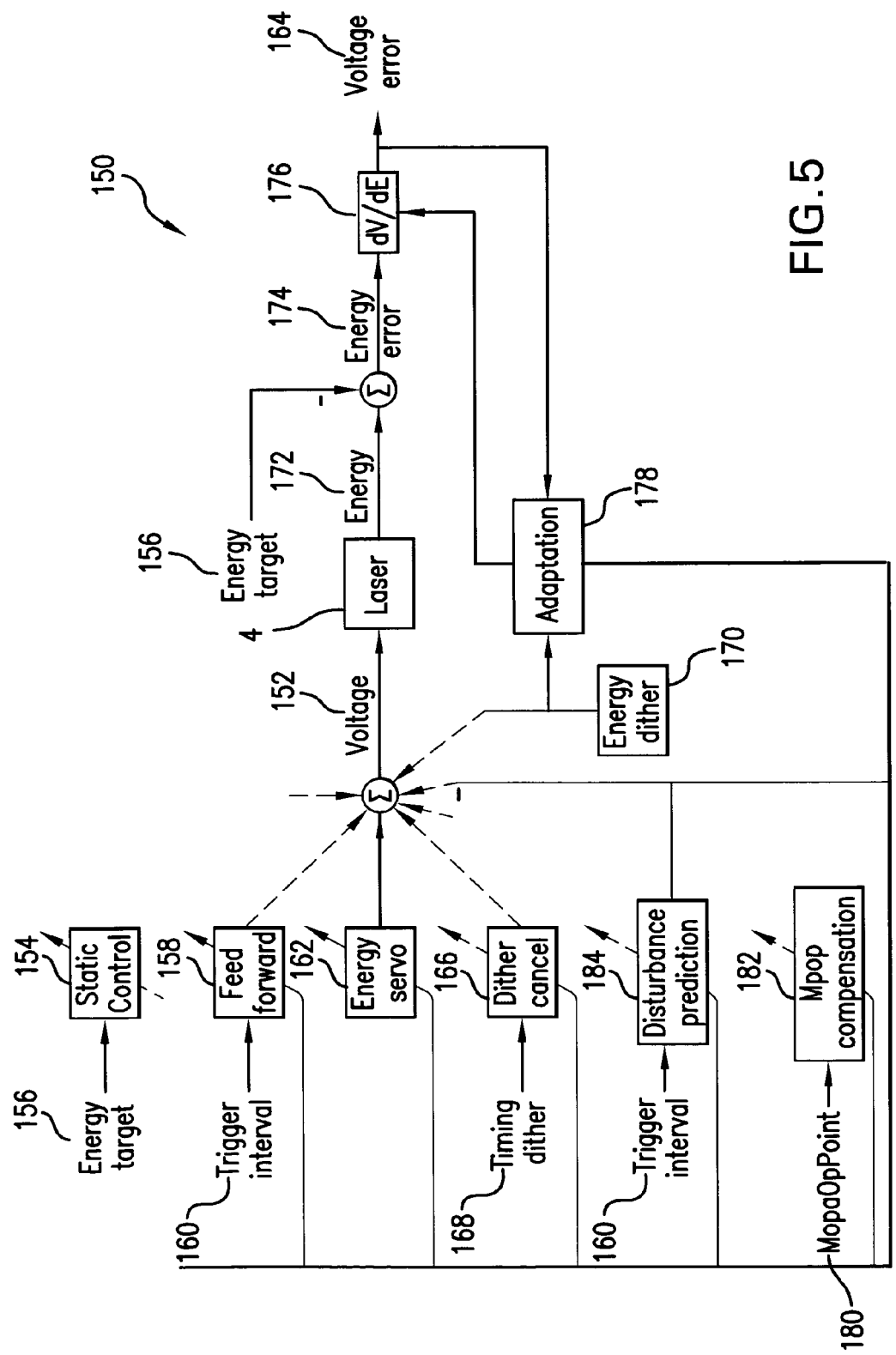
FIG. 5 is an illustration of an energy control block diagram for the MOPA/MOPRA Laser System of FIG. 1, in accordance a first exemplary embodiment of the disclosed subject matter.

FIG. 5 is an illustration of an energy control block diagram 150 for the MOPA/MOPRA laser system 10 of FIG. 11 in accordance a first exemplary embodiment of the disclosed subject matter. FIG. 5 illustrates various control elements that control a voltage input 152 to the MOPA/MOPRA laser system 10. The energy control block diagram 150 includes a static control 154, which provides a basically determined voltage anticipated to achieve an energy target 156 (if there are no other influences for which account need be made). Part of a purpose of the static control 154 is to make the energy controller responsive to changes in the energy target 156. If a user adjusts an energy target, the first voltage input 152 for the first shot should be computed to meet the new energy setpoint. The static control 154 may provide the following voltage signal:

$$V = (dV/dE)_{ref} * (E_{target} - E_{ref}) + \epsilon (E_{target} - E_{ref})^2 + V_{ref}$$

where $E_{ref}$ is approximately set to a nominal energy of the laser system 10 and $V_{ref}$ is the voltage approximately required to fire the laser at $E_{ref}$.

A feed forward block 158 provides a voltage adjustment based on a trigger interval 160. Trigger interval 160 is used to compute repetition rate, shot number and duty cycle, which impact the 'voltage input-energy output' relationship. The voltage adjustment for the trigger interval 160 is computed as a function of these values. More specifically, the voltage signal provided by the feed forward block 158 may be given by:

$$V = f_0(D) + f_1(R,n)$$

where D is the duty cycle, R is the repetition rate, and n is the shot number. Note that the feed forward voltage has two terms. One term, $f_0$, depends on duty cycle and/or burst interval, and another term, $f_1$, depends on shot number and repetition rate. By design, $f_1$ is identically zero on the first shot of each burst. Therefore, $f_0$ alone determines the feed forward voltage for the first shot of the burst. This term is intended to adjust the laser for changes in efficiency, which typically persists throughout a burst. The $f_1$ term captures the shape of any transients. This law assumes that duty cycle or interburst interval effect just moves the energy vs. shot number up or down equal amounts for all shots in a burst. The shape of the energy transient is assumed to depend only on repetition rate. The $f_1(R,n)$ function compensates for the shape of the energy transient.

The $f_1(R,n)$ function is maintained as a table versus repetition rate and shot number. A simple integrator is used to adapt the bins. In the past, the bins were initialized to zero, requiring several bursts before the laser control was correctly inverting the transient at the repetition rate. Instead of initializing these bins with zero, feed forward bins may be initialized with values of trained bins that are nearest in frequency. Initializing the bins with a value nearer the correct value for the shape of the energy transient allows the laser control more quickly, and with greater accuracy, to invert the transient at the repetition rate.

An energy servo 162 adjusts the voltage input 152 based on a calculated voltage error 164 of the previous shot within the same burst. The adjustment from the energy servo 162 may be calculated in at least a couple of different modes. First, IISquared feedback is a feedback law known to those having ordinary skill in the art. This feedback law feeds back one voltage proportional to an integral of the voltage error (an integral gain) and another proportional to the voltage error integrated twice (an I squared gain). Several sets of gains are provided for the IISquared filter: soft; hard; and MO. Soft gains are used in operational modes when the objective is to minimize shot to shot energy error. Soft gains are selected to minimize energy errors. Hard gains are used in dose and sigma modes. The hard gains are intended to minimize dose (integrated energy error) and tend to be larger than the soft gains. The MO gains are used in MO energy control modes and are also intended to minimize energy errors.

An alternative to IISquared feedback is dose feedback. Like the IISquared controller with hard gains, the dose feedback controller is intended to minimize dose, however, it uses a control law that gives better performance with non-rectangular dose windows (e.g., trapezoidal dose windows). Dose feedback is controlled by a dimensioning parameter and a vector of gains. The dose feedback controller is available only in dose and sigma modes and may utilize a Linear Quadratic Regulator to minimize the quadratic sum of energy dose and energy error 172. Utilization of the Linear Quadratic Regulator instead of 100% integral feedback has been shown in tests to reduce energy dose error by approximately 25%.

The effect of the laser system 4, as shown in FIG. 5, is to translate the voltage input 152 to energy (evaluated by the energy measurement 172) through a static gain. In addition, there are a set of disturbances added to the energy signal. Thus, the state of the system can be equated to the disturbance dynamics and the dose operator. The energy servo 162 is directed to providing voltage adjustments responsive to the behavior of the dose operator. The energy dose feedback may be calculated as the inner product of a state feedback vector, K and a vector characterizing the state of the dose operator, xd.

$$V\text{dose} = -K\,xd$$

where K is computed as a solution of a linear quadratic regulator which minimizes a weighted sum of the square of the energy error and the square of the energy dose error.

A dither cancellation 166 adjusts voltage to cancel energy changes caused by a timing dither 168. A side effect of this cancellation is that it estimates the derivative of voltage with respect to MOPA/MOPRA timing at fixed energy, a value used to compute MopaOpPoint 180 (operating point of the MOPA laser system, u, which may be defined as:

$$u = 1/E * dV/dt \text{ at constant energy,}$$

where E is laser energy, V is voltage and t is MOPA timing, the difference in firing times between the MO and PA chambers). For certain aspects of timing control, the local slope of the timing versus energy curve is needed. This information is obtained by applying a dither signal to the differential timing commanded to the MO and PA commutator triggers. Because timing couples into energy, this dither signal produces a matching dither in energy. The dither cancellation algorithm adaptively finds a voltage signal which when applied to the laser exactly cancels the dither in energy produced by the timing dither signal. Thus, the timing dither no longer appears in the energy signal and therefore has no impact on energy sigma or energy dose.

A by-product of this cancellation algorithm is the derivative of voltage with respect to timing at fixed energy. This by-product is the slope information that the timing dither was applied to identify in the first place. A parameter used in the laser control system for gas control, dMpopdMopa (the derivative of MopaOpPoint with respect to the difference between MO and PA chamber firing times), may be used to make the dither cancellation approximately instantly responsive to changes in MOPA timing (the difference in MO and PA chamber firing times). If this parameter is off, then on "'large'" (1-2 ns) changes in MOPA/MOPRA timing, MopaOpPoint 180 ("Mpop") will jump to a new value and then over then next several thousand shots, drift to a different value. During the time while the MopaOpPoint 180 estimate is converging, some of the timing dither signal will bleed through into energy. If the aforementioned gas control parameter is set correctly, MopaOpPoint 180 should jump to a new value on a "large" MOPA/MOPRA timing change and then remain at the new value with materially diminished drift.

As noted, with respect to FIG. 4, utilizing trapezoidal windows, there are clearly zeros for all windows at 20% and 40% of the sample rate (where the leading and trailing edges of the trapezoidal windows are 5 pulses). The amplitude of a dither may be set low normally to reduce the energy dither, but the low amplitude delays calculation of the derivative of the energy dose verses voltage estimate. If the dither is moved under the zero of one of the trapezoidal windows, the amplitude can be raised with diminished negative impact.

Mpop compensation 182 adjusts the voltage input 152 to compensate for changes in MOPA timing. This adjustment is primarily to stabilize energy for changes of a DtMopaTarget in excess of approximately 1 nanosecond. If a laser is running with bandwidth control enabled (ASC) and is currently operating away from a resonance, to keep bandwidth up, the control system has decreased the delay between MO and PA triggers. At this point, MopaOpPoint will be a low, negative value because DtMopaTarget is several ns below the value for peak efficiency. Then, the scanner 2 switches repetition rate to one which lies on a bandwidth resonance. Bandwidth goes up and the bandwidth controller advances DtMopaTarget by a few ns to compensate. This moves the laser several ns closer to peak efficiency and energy increases in a stepwise manner. This step change in energy will affect energy dose until the energy servo 162 has a chance to compensate.

In the meantime, MopaOpPoint compensation 182 combats this effect. Using the same value used to adjust dither cancellation for changes in Mopa timing, dMpopDMopa, it is possible to compute the amount voltage will need to change for a given change in Mopa timing. When Mopa timing is changed quickly, the MopaOpPoint compensation 182 can predict what voltage change that is also needed and provide an appropriate voltage signal to the voltage input 152 without having to wait for an energy error 174 to appear. The MopaOpPoint compensation 182 may be described as:

$$V = Eu^2/2k$$

where E is the laser energy, u is the MopaOpPoint, and k is dMpopDMopa or the derivative of MopaOpPoint with respect to Mopa timing, the difference in firing time between the MO and PA chambers.

A disturbance prediction 184 adjusts the voltage input 152 based on a prediction of the voltage error, assuming that the disturbance acting on energy is a DC offset plus several tones. The tones are at frequencies that are multiples of the MO and PA/PO blower speeds. This predicted voltage error is subtracted from the voltage input 152, thus removing the effects due to DC offset or blower blade passage.

Finally, an energy dither 170 provides a periodic signal added to the voltage input 152 used to estimate the effects of voltage on MO energy, output energy, and MOPA timing. The periodic signal from the energy dither 170 is n shots long and may be described by the equation:

$$V[k] = A \cos(2\pi n_d k/n) \; k=0,\ldots,n-1$$

where A is the dither amplitude and $n_d$ is the number of cosine periods within one full cycle of the dither.

The dither signal is held off for a fixed number of shots before being started in each burst. The delay is provided so that the dither cannot combine with beginning of burst effects to push the laser 4 out of spec. In order to prevent other signal at or near the dither frequency from interfering with derivative estimates, the phase of the dither signal may be randomized. Randomization is done by randomizing the value of k in the above equation to start the dither. For the windows shown in FIG. 3, the dither frequency is 1 fifth of the rep rate (5 shots leading and trailing each trapezoidal window). This is a key frequency for lasers using trapezoidal windows to calculate dose. For windows which have four pulse leading and trailing edges, 20% of the rep rate lies inside a zero of the dose operator. Hence, dithering at this frequency will have no effect on dose.

These voltage signals are added together to generate the voltage input 152. As the laser fires, the energy is measured 172. The energy target is subtracted from the measured energy to create an energy error signal 174, which is scaled by dV/dE, the laser estimate 176 of the derivative of voltage with respect to energy. The resulting voltage error 164 is used to drive adaptation algorithms 178 which adjust some of the voltage signals in a way that minimizes energy errors, dose errors, or energy sigma, or some combination thereof.

Figure 6:
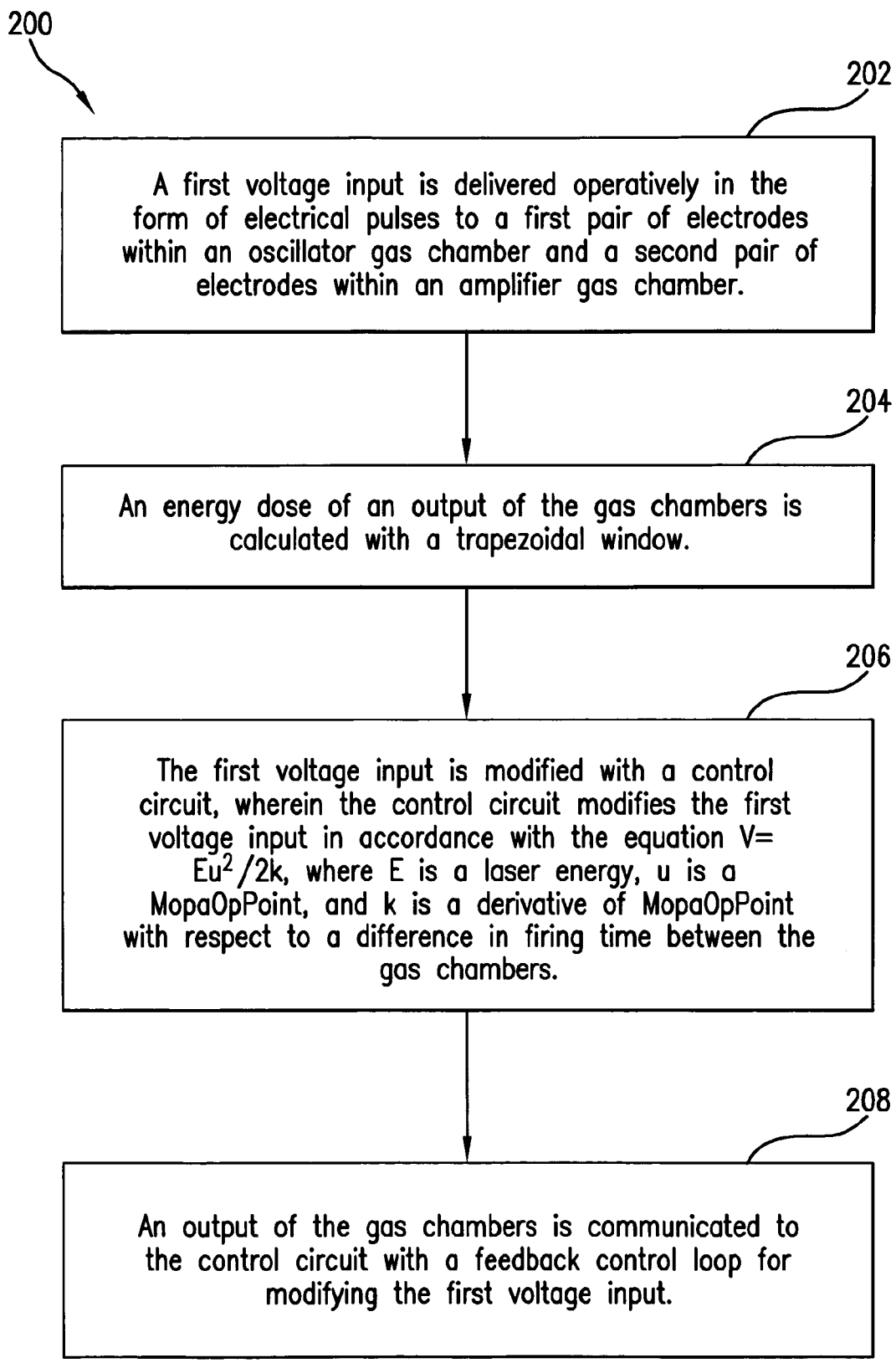
FIG. 6 is a flowchart illustrating a method of providing the laser control system of FIG. 5, in accordance with the first exemplary embodiment of the disclosed subject matter.

FIG. 6 is a flowchart 200 illustrating a method of providing the laser control system 150 of FIG. 5, in accordance with the first exemplary embodiment of the disclosed subject matter. It should be noted that any process descriptions or blocks in flow charts should be understood as representing modules, segments, portions of code, or steps that include one or more instructions for implementing specific logical functions in the process, and alternate implementations are included within the scope of the disclosed subject matter in which functions may be executed out of order from that shown or discussed, including substantially concurrently or in reverse order, depending on the functionality involved, as would be understood by those reasonably skilled in the art of the disclosed subject matter.

As is shown by block 202, a first voltage input is delivered operatively in the form of electrical pulses to a first pair of electrodes within an oscillator gas chamber and a second pair of electrodes within a amplifier gas chamber. An energy dose of an output of the gas chambers is calculated with a trapezoidal window (block 204). The first voltage input is modified with a control circuit, wherein the control circuit modifies the first voltage input in accordance with the equation $V = Eu^2/2k$, where E is a laser energy, u is a MopaOpPoint, and k is a derivative of MopaOpPoint with respect to a difference in firing time between the gas chambers (block 206). An output of the gas chambers is communicated to the control circuit with a feedback control loop for modifying the first voltage input (block 208).

It should be emphasized that the above-described embodiments of the disclosed subject matter, particularly, any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the disclosed subject matter and protected by the following claims.

What is claimed is:

1. A laser control system, comprising:
   an oscillator gas chamber;
   an amplifier gas chamber;
   a first voltage input operatively connected to deliver electrical pulses to a first pair of electrodes within the oscillator gas chamber and a second pair of electrodes within the amplifier gas chamber;
   an output of the gas chambers is an energy dose calculated by a trapezoidal window;
   a control circuit connected to the first voltage input for modifying the first voltage input, wherein the control circuit modifies the first voltage input in accordance with the equation $V = Eu^2/2k$, where E is a laser energy, u is a MopaOpPoint, and k is a derivative of MopaOpPoint with respect to a difference in firing time between the gas chambers; and
   a feedback control loop communicating an output of the gas chambers to the control circuit for modifying the first voltage input.

2. The laser control system of claim 1, wherein the first voltage input further comprises an input computed from an energy target as $V = (dV/dE)_{ref} * (E_{target} - E_{ref}) + \epsilon(E_{target} - E_{ref})^2 + V_{ref}$, where $E_{ref}$ is approximately set to a nominal energy of the laser system 10 and $V_{ref}$ is the voltage approximately required to fire the laser at $E_{ref}$.

3. The laser control system of claim 1, wherein a frequency response to a dose operator has at least one zero and the control circuit further comprises an energy dither initiated under one of the zeros.

4. The laser control system of claim 3, wherein a periodic signal from the energy dither is n shots long, has an amplitude A, and satisfies $V[k]=A\cos(2\pi n_d k/n)$, where $k=0$ to $n-1$ and $n_d$ is the number of cosine periods within one full cycle of the dither.

5. The laser control system of claim 1, wherein a frequency response to a dose operator has at least one zero and a timing dither is arranged to initiate under one of the zeros.

6. The laser control system of claim 1, wherein the control circuit further comprises an energy dose feedback circuit calculated as $V_{dose}=-K\,xd$, where K is a state feedback vector computed as a solution of a linear quadratic regulator that minimizes a weighted sum of the square of the energy error and the square of the energy dose error and xd is a vector characterizing a state of a dose operator.

7. The laser control system of claim 1, wherein the control circuit further comprises a function of energy transients, wherein a plurality of repetition rate bins are initialized for a non-zero value.

8. The laser control system of claim 7, wherein the repetition rate bins are initialized to values of trained bins having a similar repetition rate.

9. The laser control system of claim 1, wherein the control circuit further comprises a linear quadratic regulator to feed back a state of a filter that approximates a dose operator.

10. A method of controlling a laser system, the method comprising the steps of:
 delivering a first voltage input operatively in the form of electrical pulses to a first pair of electrodes within an oscillator gas chamber and a second pair of electrodes within an amplifier gas chamber;
 calculating an energy dose of an output of the gas chambers with a trapezoidal window;
 modifying the first voltage input with a control circuit, wherein the control circuit modifies the first voltage input in accordance with the equation $V=Eu^2/2k$, where E is a laser energy, u is a MopaOpPoint, and k is a derivative of MopaOpPoint with respect to a difference in firing time between the gas chambers; and
 communicating an output of the gas chambers to the control circuit with a feedback control loop for modifying the first voltage input.

11. The method of claim 10, further comprising calculating the first voltage input further comprises an input computed from an energy target as $V=(dV/dE)_{ref}*(E_{target}-E_{ref})+\epsilon(E_{target}-E_{ref})^2+V_{ref}$, where $E_{ref}$ is approximately set to a nominal energy of the laser system 10 and $V_{ref}$ is the voltage approximately required to fire the laser at $E_{ref}$.

12. The method of claim 10, wherein a frequency response to a dose operator has at least one zero and wherein the step of modifying the first voltage input further comprises initiating an energy dither under one of the zeros.

13. The method of claim 12, wherein a periodic signal from the energy dither is n shots long, has an amplitude A, and satisfies $V[k]=A\cos(2\pi n_d k/n)$, where $k=0$ to $n-1$ and $n_d$ is the number of cosine periods within one full cycle of the dither.

14. The method of claim 10, wherein a frequency response to a dose operator has at least one zero and wherein the step of modifying the first voltage input further comprises initiating a timing dither under one of the zeros.

15. The method of claim 10, the step of modifying further comprising adding to the first voltage input an energy dose feedback calculated as $V_{dose}=-K\,xd$, where K is a state feedback vector computed as a solution of a linear quadratic regulator that minimizes a weighted sum of the square of an energy error and the square of an energy dose error and xd is a vector characterizing a state of a dose operator.

16. The method of claim 10, wherein the control circuit further comprises a function of energy transients, further comprising the step of initializing a plurality of repetition rate bins for non-zero values.

17. The method of claim 16, wherein the non-zero values further comprise values of trained bins having a similar repetition rate.

18. The method of claim 10, further comprising the step of feeding back a state of a filter that approximates a dose operator with a linear quadratic regulator.

19. A control system for controlling a laser system, the control system comprising:
 means for delivering a first voltage input operatively in the form of electrical pulses to a first pair of electrodes within an oscillator gas chamber and a second pair of electrodes within an amplifier gas chamber;
 means for calculating an energy dose of an output of the gas chambers with a trapezoidal window;
 means for modifying the first voltage input with a control circuit, wherein the control circuit modifies the first voltage input in accordance with the equation $V=Eu^2/2k$, where E is a laser energy, u is a MopaOpPoint, and k is a derivative of MopaOpPoint with respect to a difference in firing time between the gas chambers; and
 means for communicating an output of the gas chambers to the control circuit with a feedback control loop for modifying the first voltage input.

20. The control system of claim 19, further comprising means for adding to the first voltage input an energy dose feedback calculated as $V_{dose}=-K\,xd$, where K is a state feedback vector computed as a solution of a linear quadratic regulator that minimizes a weighted sum of the square of an energy error and the square of an energy dose error and xd is a vector characterizing a state of a dose operator.

* * * * *